United States Patent
Cho

(10) Patent No.: US 9,438,274 B2
(45) Date of Patent: Sep. 6, 2016

(54) DATA PROCESSING BLOCK AND DATA STORAGE DEVICE INCLUDING THE SAME

(71) Applicant: SK hynix Inc., Gyeonggi-do (KR)

(72) Inventor: Sung Gun Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 197 days.

(21) Appl. No.: 14/316,436

(22) Filed: Jun. 26, 2014

(65) Prior Publication Data

US 2015/0280745 A1  Oct. 1, 2015

(30) Foreign Application Priority Data

Mar. 27, 2014 (KR) .................. 10-2014-0036223

(51) Int. Cl.
*H03M 13/00* (2006.01)
*H03M 13/15* (2006.01)

(52) U.S. Cl.
CPC ..... *H03M 13/1525* (2013.01); *H03M 13/1545* (2013.01); *H03M 13/617* (2013.01); *H03M 13/152* (2013.01)

(58) Field of Classification Search
CPC .................. H03M 13/1525; H03M 13/1545; H03M 13/152; H03M 13/617

USPC .................................................. 714/781, 784
See application file for complete search history.

(56) References Cited

U.S. PATENT DOCUMENTS

| | | | |
|---|---|---|---|
| 7,096,408 B1 * | 8/2006 | Ireland | G06F 7/724 714/784 |
| 7,237,183 B2 * | 6/2007 | Xin | H03M 13/15 714/782 |
| 8,132,081 B1 | 3/2012 | Wu | |
| 9,246,515 B2 * | 1/2016 | Kong | H03M 13/1515 |
| 2012/0131423 A1 | 5/2012 | Wu | |

FOREIGN PATENT DOCUMENTS

KR  1020120064377  6/2012

* cited by examiner

*Primary Examiner* — Christine Tu
(74) *Attorney, Agent, or Firm* — IP & T Group LLP

(57) ABSTRACT

A data processing block that includes a syndrome computation unit suitable for generating odd syndrome values in response to a received codeword, an ELP solver suitable for generating even syndrome values, based on the odd syndrome values in a first mode, and generating an error location polynomial, based on the odd syndrome values and the even syndrome values in a second mode, and a Chien search unit suitable for generating solutions of the error location polynomial.

16 Claims, 10 Drawing Sheets

DATA PROCESSING BLOCK AND DATA STORAGE DEVICE INCLUDING THE SAME

CROSS-REFERENCES TO RELATED APPLICATION

The present application claims priority under 35 U.S.C. §119(a) to Korean application number 10-2014-0036223, filed on Mar. 27, 2014, in the Korean Intellectual Property Office, which is incorporated herein by reference in its entirety.

BACKGROUND

1. Technical Field

Various embodiments relate to a data storage device, and more particularly, to a data processing block which is included in a data storage device and performs a decoding operation.

2. Related Art

Nonvolatile memory apparatus retain stored data even though power is not supplied. Nonvolatile memory apparatus include flash memory apparatus such as NAND flash and NOR flash, FeRAM (ferroelectric random access memory), PRAM (phase-change random access memory), MRAM (magnetoresistive random access memory) and ReRAM (resistive random access memory).

Nonvolatile memory apparatus may be used in a system which requires continuous retention of data. For example, a nonvolatile memory apparatus may be used in a digital camera to store images. For another example, the memory apparatus may be used in a digital audio player to store audio data.

The data transmitted to an external device from a nonvolatile memory apparatus by an external read request may be damaged due to various reasons and may include errors. The errors may occur in the data when or while the data is stored in the nonvolatile memory apparatus. The errors may also occur in the data while the data is transmitted to the external device through a data bus after being read from the nonvolatile memory apparatus. Therefore, a system including the nonvolatile memory apparatus may additionally include an ECC (error correction code) unit to detect and correct the errors in the data.

SUMMARY

In an embodiment of the present invention, a data processing block may include a syndrome computation unit suitable for generating odd syndrome values in response to a received codeword, an error location polynomial (ELP) solver suitable for generating even syndrome values, based on the odd syndrome values in a first mode, and generating an error location polynomial, based on the odd syndrome values and the even syndrome values in a second mode; and a Chien search unit suitable for generating solutions of the error location polynomial.

In an embodiment of the present invention, a data storage device may include a nonvolatile memory apparatus suitable for reading a stored codeword, and a data processing block suitable for performing a decoding operation for the codeword, wherein the data processing block including a syndrome computation unit suitable for generating odd syndrome values in response to the codeword, an error location polynomial (ELP) solver suitable for generating even syndrome values, based on the odd syndrome values in a first mode, and generating an error location polynomial, based on the odd syndrome values and the even syndrome values in a second mode; and a Chien search unit suitable for generating solutions of the error location polynomial.

BRIEF DESCRIPTION OF THE DRAWINGS

Features, aspects, and embodiments are described in conjunction with the attached drawings, in which.

DETAILED DESCRIPTION

A data processing block and a data storage device including the same according to the present invention will be described below with reference to the accompanying drawings through exemplary embodiments.

Figure 1:
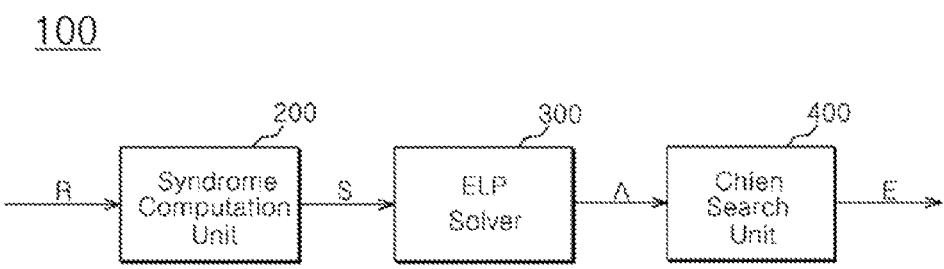
FIG. 1 is a block diagram exemplarily showing a data processing block in accordance with an embodiment of the present invention.

FIG. 1 is a block diagram exemplarily showing a data processing block 100 in accordance with an embodiment of the present invention.

The data processing block 100 may include a syndrome computation unit 200, an ELP (error location polynomial) solver 300, and a Chien search unit 400. The data processing block 100 may perform a decoding operation for a received codeword R, for example, based on a BHC (Bose-Chaudhuri-Hocquenghem) code algorithm.

The syndrome computation unit 200 may generate odd syndrome values from the received codeword R. For example, in the case where the received codeword R does not include an error at all, all the odd syndrome values may be generated as 0. In this case, an error correcting operation may not be performed any more. For another example, in the case where the received codeword R includes an error, the odd syndrome values may be generated as a value that is not 0. In this case, generated odd syndrome values S may be transmitted to the ELP solver 300.

The ELP solver 300 may operate in an even syndrome value generation mode (hereinafter, referred to as a 'first mode') and an error location polynomial generation mode (hereinafter, referred to as a 'second mode'). In the first mode, the ELP solver 300 may generate even syndrome values, based on the odd syndrome values S which are transmitted from the syndrome computation unit 200. In the second mode, the ELP solver 300 may perform an error location polynomial generating operation, based on the odd syndrome values S and the generated even syndrome values. The ELP solver 300 may generate an error location polynomial $\Lambda$, based on, for example, a Berlekamp-Massey algorithm or a Euclidean algorithm.

The Chien search unit 400 may generate a solution E of the error location polynomial Λ which is generated by the ELP solver 300. The solution E of the error location polynomial Λ may be used to detect the error included in the received codeword R.

Figure 2:
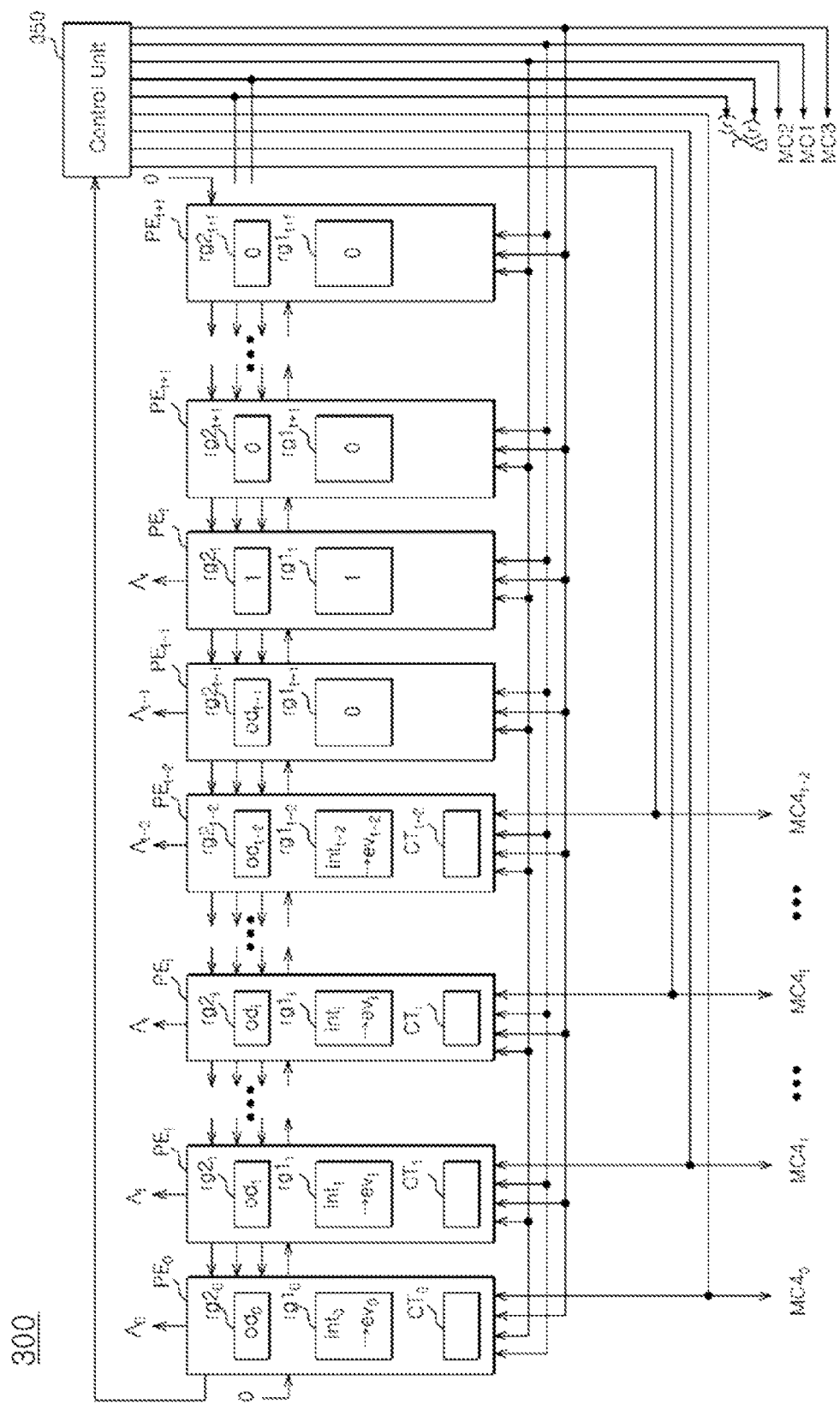
FIG. 2 is a block diagram exemplarily showing the ELP solver shown in FIG. 1.

FIG. 2 is a block diagram exemplarily showing the ELP solver 300 shown in FIG. 1.

The ELP solver 300 may include a control unit 350 and a plurality of processing units $PE_0$ to $PE_{t+f}$. The ELP solver 300 may include t+f+1 number of processing units PE, based on an error correction capability t of the data processing block 100 and a parameter f that may be set based on a specified probability value.

The control unit 350 may control the plurality of processing units $PE_0$ to $PE_{t+f}$ depending on the first mode and the second mode. In the first mode, the control unit 350 may control the processing units $PE_0$ to $PE_{t-2}$ in such a manner that even syndrome values $ev_0$ to $ev_{t-2}$ necessary for generating the error location polynomial Λ are generated, based on the odd syndrome values S transmitted from the syndrome computation unit 200. In the second mode, the control unit 350 may control the processing units $PE_0$ to $PE_{t+f}$ such that coefficients $\Lambda_0$ to $\Lambda_t$ of the error location polynomial Λ are generated. The processing units $PE_0$ to $PE_{t-2}$ may be referred to as calculation processing units. The processing units $PE_{t-1}$ to $PE_{t+f}$ may be referred to as standby processing units.

The control unit 350 may output gamma $\Gamma^{(r)}$, delta $\Delta^{(r)}$ and first to third control signals MC1 to MC3 which are inputted to the plurality of processing units $PE_0$ to $PE_{t+f}$ depending on the first mode and the second mode. The gamma $\Gamma^{(r)}$ and the delta $\Delta^{(r)}$ may be Galois field elements.

The control unit 350 may output fourth control signals $MC4_0$ to $MC4_{t-2}$ respectively corresponding to the processing units $PE_0$ to $PE_{t-2}$ depending on the first mode and the second mode. The control unit 350 may output the fourth control signals $MC4_0$ to $MC4_{t-2}$ to control the processing units $PE_0$ to $PE_{t-2}$ to square respective initial values $int_0$ to $int_{t-2}$ in the first mode.

Each of the processing unites $PE_0$ to $PE_{t-2}$ may perform a computing operation or a latching operation under the control of the control unit 350 in the first mode. A computing operation may be defined as an operation of squaring a value set as an initial value and feeding back a squared value being a squaring result, as a new initial value. A latching operation may be defined as an operation of conserving a value set as an initial value.

In the computing operation, the processing units $PE_0$ to $PE_{t-2}$ may be inputted with corresponding odd syndrome values (hereinafter, referred to as 'first odd syndrome values') among the odd syndrome values S transmitted from the syndrome computation unit 200, as original initial values $int_0$ to $int_{t-2}$. The processing units $PE_0$ to $PE_{t-2}$ may generate even syndrome values $ev_0$ to $ev_{t-2}$ which are different from one another, through the computing operation, based on the corresponding initial values $int_0$ to $int_{t-2}$. The processing units $PE_0$ to $PE_{t-2}$ may repeatedly perform the computing operation for the number of times necessary to generate the corresponding even syndrome values $ev_0$ to $ev_{t-2}$.

The processing units $PE_0$ to $PE_{t-2}$ may each perform the computing operation a different numbers of times. In this case, the processing units $PE_0$ to $PE_{t-2}$ may complete their computing operation at different times. When the processing unit $PE_i$ has completed the computing operation, that is, it has generated the even syndrome value $ev_i$ before the computing operation of all the processing units $PE_0$ to $PE_{t-2}$ is completed, the processing unit $PE_i$ may perform the latching operation until the computing operation of all the processing units $PE_0$ to $PE_{t-2}$ is completed. The processing units $PE_0$ to $PE_{t-2}$ may conserve the corresponding even syndrome values $ev_0$ to $ev_{t-2}$ through the latching operation.

In the case where the computing operation of all the processing units $PE_0$ to $PE_{t-2}$ is completed, the plurality of processing units $PE_0$ to $PE_{t+f}$ may operate in the second mode. In the second mode, the plurality of processing units $PE_0$ to $PE_{t+f}$ may perform the error location polynomial generating operation, based on second odd syndrome values $od_0$ to $od_{t-1}$ and the generated even syndrome values $ev_0$, $ev_1$, . . . , and $ev_{t-2}$. The second odd syndrome values $od_0$ to $od_{t-1}$ may be values corresponding to the processing units $PE_0$ to $PE_{t-1}$ among the odd syndrome values S transmitted from the syndrome computation unit 200.

The plurality of processing units $PE_0$ to $PE_{t+f}$ may include first registers $rg1_0$, $rg1_1$, . . . , and $rg1_{t+f}$, and second registers $rg2_0$, $rg2_1$, . . . , and $rg2_{t+f}$, respectively. The processing units $PE_0$ to $PE_{t-2}$ may include squaring control sections $CT_0$, $CT_1$, . . . , and $CT_{t-2}$, respectively.

In the first mode, the squaring control sections $CT_0$ to $CT_{t-2}$ may control the computing operation such that the initial values $int_0$ to $int_{t-2}$ corresponding to them are squared, in response to the corresponding fourth control signals $MC4_0$ to $MC4_{t-2}$.

The first registers $rg1_0$ to $rg1_{t-2}$ may be respectively inputted with the original initial values $int_0$ to $int_{t-2}$ for performing the computing operation, upon entry to the first mode. The first registers $rg1_0$ to $rg1_{t-2}$ may respectively store the even syndrome values $ev_0$ to $ev_{t-2}$ generated through the computing operation, upon entry to the second modes The first registers $rg1_{t-1}$ to $rg1_{t+f}$ may respectively store setting values (0 or 1) necessary for generating the error location polynomial Λ, upon entry to the second mode.

The second registers $rg2_0$ to $rg2_{t-1}$ may respectively store the second odd syndrome values $od_0$ to $od_{t-1}$ necessary for generating the error location polynomial Λ, upon entry to the second mode. According to an embodiment, the second registers $rg2_0$ to $rg2_{t-1}$ may be respectively inputted with the second odd syndrome values $od_0$ to $od_{t-1}$, upon entry to the first mode. The second registers $rg2_t$ to $rg2_{t+f}$ may respectively store setting values (0 or 1) necessary for generating the error location polynomial Λ, upon entry to the second mode.

Figure 3:
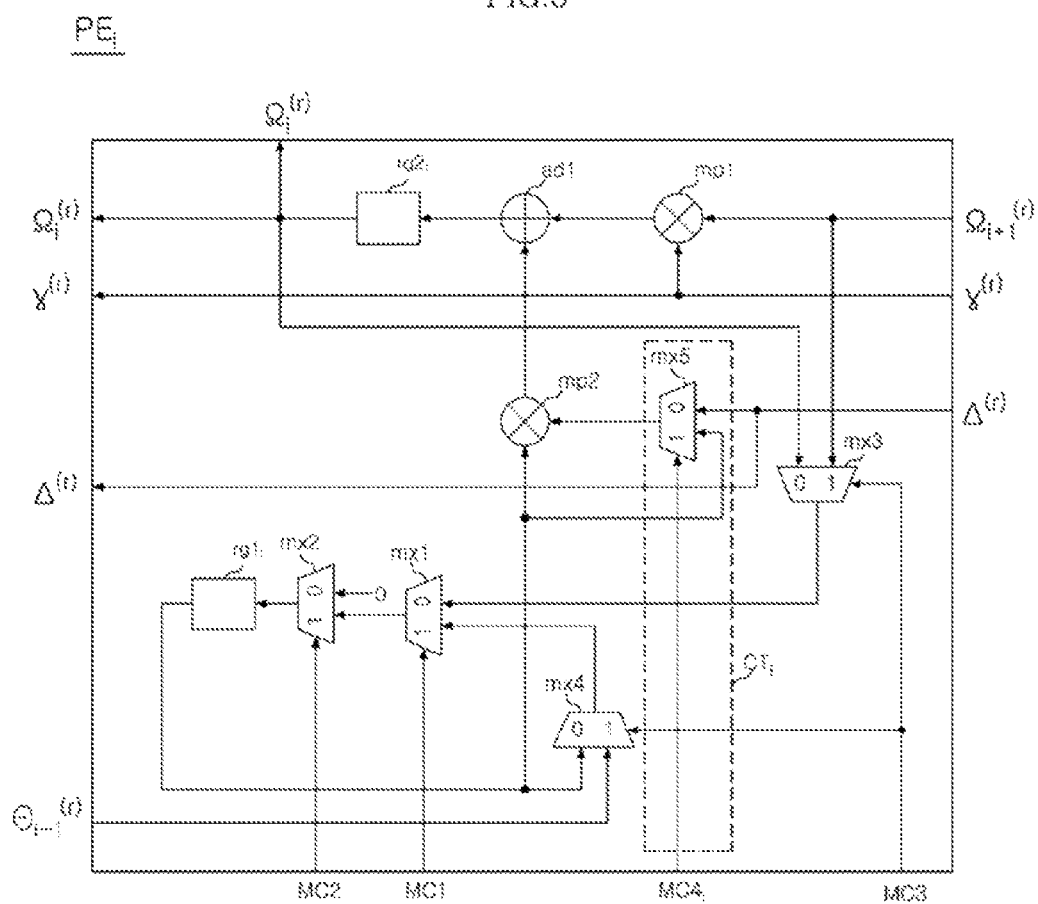
FIG. 3 is a circuit diagram showing in detail the configuration of the processing unit shown in FIG. 2.

FIG. 3 is a circuit diagram showing in detail the configuration of the processing unit $PE_i$ shown in FIG. 2. The configuration and the operating method of each of the plurality of processing units $PE_0$ to $PE_{t-2}$ shown in FIG. 2 may be substantially the same as the configuration and the operating method of the processing unit $PE_i$ of FIG. 3.

The processing unit $PE_i$ may include the first register $rg1_i$, the second register $rg2_i$, first to fourth multiplexers mx1 to mx4, first and second multipliers mp1 and mp2, an adder ad1, and the squaring control section $CT_i$.

The first multiplier mp1 may perform multiplication for the gamma $\Gamma^{(r)}$ and a second omega $\Omega_{i+1}^{(r)}$. The adder ad1 may perform addition for the output of the first multiplier mp1 and the output of the second multiplier mp2. The output of the adder ad1 may be stored in the second register $rg2_i$. The value stored in the second register $rg2_i$ may be outputted as a first omega $\Omega_i^{(r)}$. The third multiplexer mx3 may selectively output the second omega $\Omega_{i+1}^{(r)}$ or the value stored in the second register $rg2_i$, in response to the third control signal MC3. The fourth multiplexer mx4 may selectively output a first theta $\Theta_{i-1}^{(r)}$ or the value stored in the first register $rg1_i$, in response to the third control signal MC3. The first multiplexer mx1 may selectively output the output of the third multiplexer mx3 or the output of the fourth multiplexer mx4 in response to the first control signal MC1. The second multiplexer mx2 may output the output of the first multiplexer mx1 or a first value, for example, 0, in response to the second control signal MC2. The output of the second multiplexer mx2 may be stored in the first register $rg1_i$. The second multiplier mp2 may perform multiplication for the value stored in the first register $rg1_i$ and the output of the squaring control section $CT_i$.

The squaring control section $CT_i$ may include a fifth multiplexer mx5. The fifth multiplexer mx5 may selectively output the value stored in the first register $rg1_i$ or the delta $\Delta^{(r)}$ in response to the fourth control signal $MC4_i$.

Figure 4:
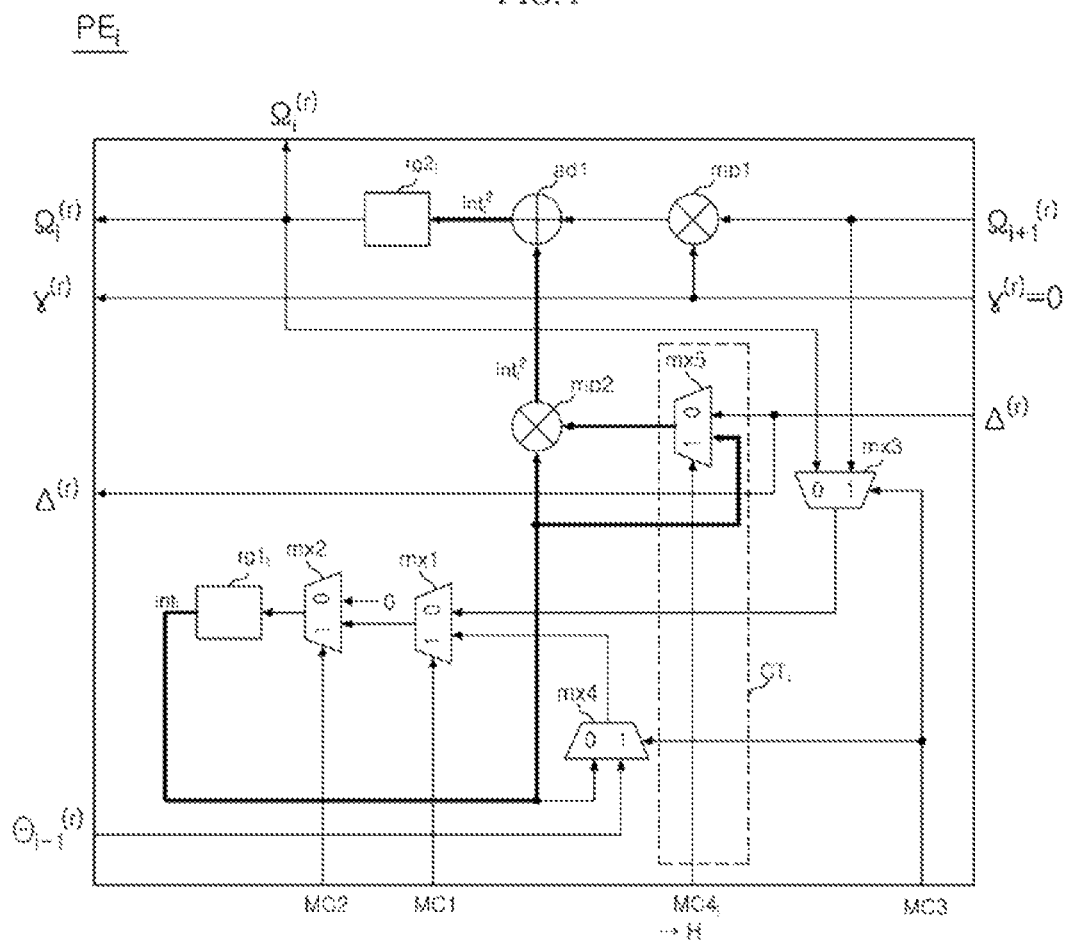
FIGS. 4 and 5 are diagrams explaining a computing operation performing method of the processing unit shown in FIG. 3.
Figure 5:
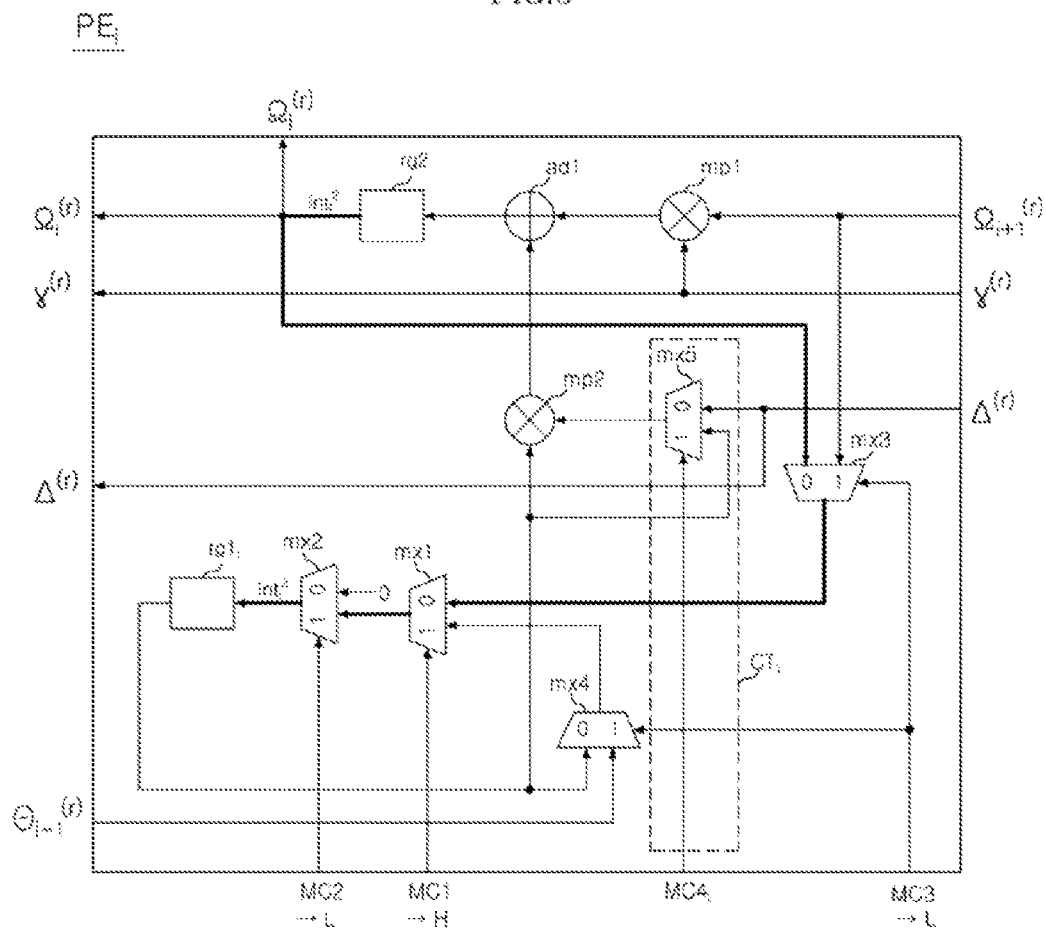

FIGS. 4 and 5 are diagrams explaining a computing operation performing method of the processing unit $PE_i$ shown in FIG. 3. FIG. 4 shows a process in which the processing unit $PE_i$ squares an initial value $int_i$ when performing the computing operation in the first mode. FIG. 5 shows a process in which the processing unit $PE_i$ feeds back a squared value $int_i^2$ as a new initial value when performing the computing operation in the first mode.

A method for the processing unit $PE_i$ to perform the computing operation in the first mode will now be described in detail with reference to FIGS. 4 and 5.

Referring to FIG. 4, the initial value $int_i$ inputted to the processing unit $PE_i$ may be stored in the first register $rg1_i$. The fifth multiplexer mx5 may output the initial value $int_i$ to the second multiplier mp2 which is inputted with the initial value $int_i$, in response to the fourth control signal $MC4_i$ of a logic high (hereinafter, denoted by H in drawings). The second multiplier mp2 may perform squaring for the initial value $int_i$. The gamma $\Gamma^{(r)}$ may be inputted as a first value, that is, 0, and accordingly, the first multiplier mp1 may output 0. The adder ad1 may add the squared value $int_i^2$ outputted from the second multiplier mp2 and 0 outputted from the first multiplier mp1. As a result, the squared value $int_i^2$ may be stored in the second register $rg2_i$ through the adder ad1.

Referring to FIG. 5, the squared value $int_i^2$ stored in the second register $rg2_i$ may be fed back to the first register $rg1_i$ and be stored therein. In detail, the third multiplexer mx3 may output the squared value $int_i^2$ stored in the second register $rg2_i$, in response to the third control signal MC3 of a logic low (hereinafter, denoted by L in drawings). The first multiplexer mx1 may output the output of the third multiplexer mx3, that is, the squared value $int_i^2$, in response to the first control signal MC1 of a logic high H. The second multiplexer mx2 may output the output of the first multiplexer mx1, that is, the squared value $int_i^2$, in response to the second control signal MC2 of a logic low L. Accordingly, the squared value $int_i^2$ may be fed back to the first register $rg1_i$ as a new initial value and be stored therein.

The processing unit $PE_i$ may repeatedly process the squared value $int_i^2$ fed back as a new initial value, through the squaring process of FIG. 4 and the feedback process of FIG. 5. The results of repeatedly performing the computing operation in which the squaring process of FIG. 4 and the feedback process of FIG. 5 are incorporated may be summarized as given in the following table.

| Number of times of computing operation | Performance result |
| --- | --- |
| 1 | $int_i \to int_i^2$ |
| 2 | $int_i \to int_i^2 \to (int_i^2)^2$ |
| 3 | $int_i \to int_i^2 \to (int_i^2)^2 \to ((int_i^2)^2)^2$ |
| . | . |
| . | . |
| . | . |
| K | $int_i^2$ |

As described above, the processing unit $PE_i$ may be inputted with the corresponding first odd syndrome value among the odd syndrome values S, as the original initial value $int_i$. The processing unit $PE_i$ may generate the even syndrome value $ev_i$ (see FIG. 2) through at least one computing operation, based on the first odd syndrome value. The processing unit $PE_i$ may repeatedly perform the computing operation a number of times necessary for generating the even syndrome value $ev_i$ that generates the error location polynomial $\Lambda$. The even syndrome value $ev_i$ generated as a result of performing the computing operation the necessary number of times may be fed back to and stored in the first register $rg1_i$.

As described above, the processing units $PE_0$ to $PE_{t-2}$ may perform the computing operation a different numbers of times to generate the corresponding even syndrome values $ev_0$ to $ev_{t-2}$. For example, the first processing unit $PE_0$ may perform the computing operation once, and the second processing unit $PE_1$ may perform the computing operation twice. The first processing unit $PE_0$ and the second processing unit $PE_1$ may simultaneously perform the computing operation once in synchronization with an internal clock. As a result of performing the computing operation, the first processing unit $PE_0$ may generate the even syndrome value $ev_0$. While the second processing unit $PE_1$ performs the computing operation one more time, the first processing unit $PE_0$ may perform the latching operation, which will be described below in detail with reference to FIG. 6, to conserve the generated even syndrome value $ev_0$.

Figure 6:
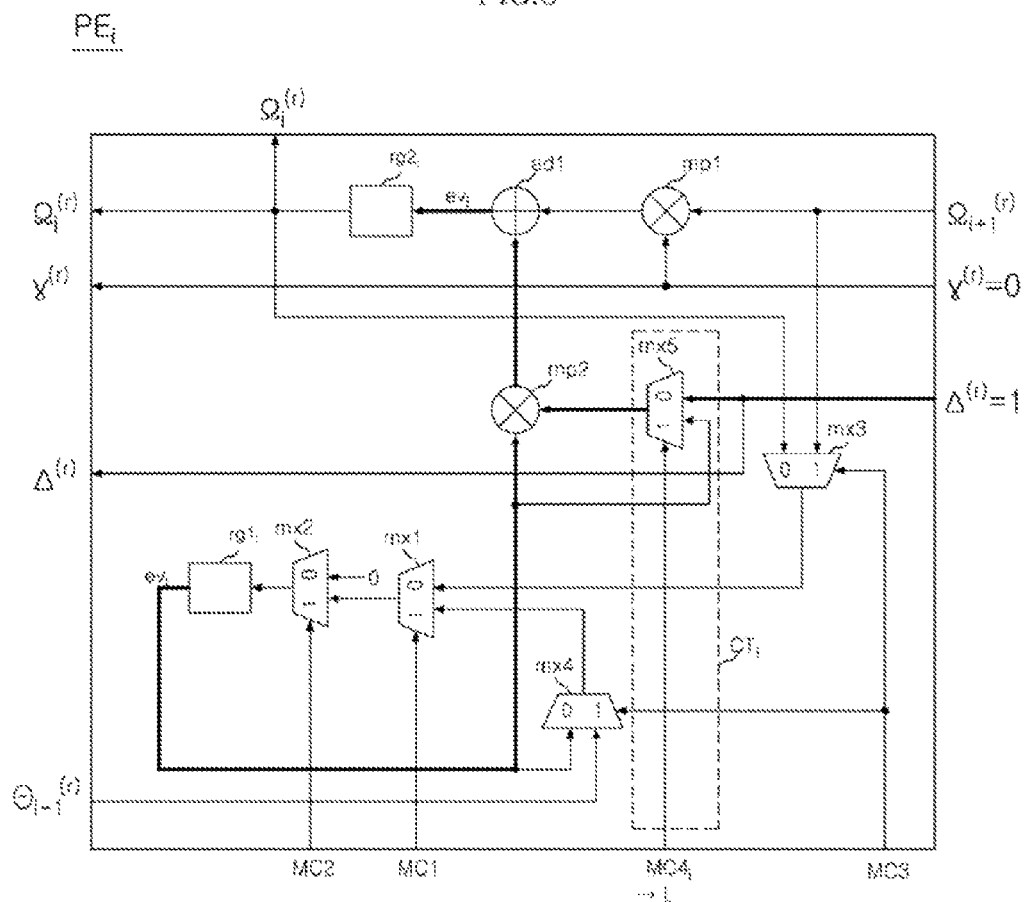
FIG. 6 is a diagram explaining a latching operation performing method of the processing unit shown in FIG. 3.

FIG. 6 is a diagram explaining a latching operation method of the processing unit $PE_i$ shown in FIG. 3.

The even syndrome value $ev_i$ generated through the computing operation may be stored in the first register $rg1_i$. The fifth multiplexer mx5 may output the delta $\Delta^{(r)}$ inputted as an identity element for multiplication, that is, 1, to the second multiplier mp2 which is inputted with the even syndrome value $ev_i$, in response to the fourth control signal $MC4_i$ of a logic low L. Accordingly, the second multiplier mp2 may output the even syndrome value $ev_i$ as it is. The gamma $\Gamma^{(r)}$ may be inputted as a first value, that is, 0, and thus, the first multiplier mp1 may output 0, The adder ad1 may add the even syndrome value $ev_i$ outputted from the second multiplier mp2 and 0 outputted from the first multiplier mp1. As a result, the even syndrome value $ev_i$ may be stored in the second register $rg2_i$ through the adder ad1.

The process shown in FIG. 6 in which the even syndrome value $ev_i$ is transmitted from the first register $rg1_i$ to the second register $rg2_i$ may be performed at substantially the same time as the squaring process of FIG. 4 which is performed by another processing unit having not completed the computing operation. The processing unit $PE_i$ performs the latching operation may be inputted with the fourth control signal $MC4_i$ corresponding to it, at the logic low, and at the same time, another processing unit which performs the computing operation may be inputted with the fourth control signal corresponding to it, at the logic high.

The even syndrome value $ev_i$ stored in the second register $rg2_i$ may be transmitted to the first register $rg1_i$ and be conserved therein. The process in which the even syndrome value $ev_i$ is transmitted from the second register $rg2_i$ to the first register $rg1_i$ may be performed in substantially the same way as the feedback process of FIG. 5. The process in which the even syndrome value $ev_i$ is transmitted from the second register $rg2_i$ to the first register $rg1_i$ may be performed at substantially the same time as the feedback process of FIG. 5 which is performed by another processing unit having not completed the computing operation. The processing unit $PE_i$ which performs the latching operation and another processing unit which performs the computing operation may be inputted with the first control signal MC1 at the logic high, the second control signal MC2 at the logic low and the third control signal MC3 at the logic low.

The processing unit $PE_i$ may repeatedly perform the latching operation for the even syndrome value $ev_i$ until all the computing operations of the processing units $PE_0$ to $PE_{t-2}$ are completed.

Figure 7:
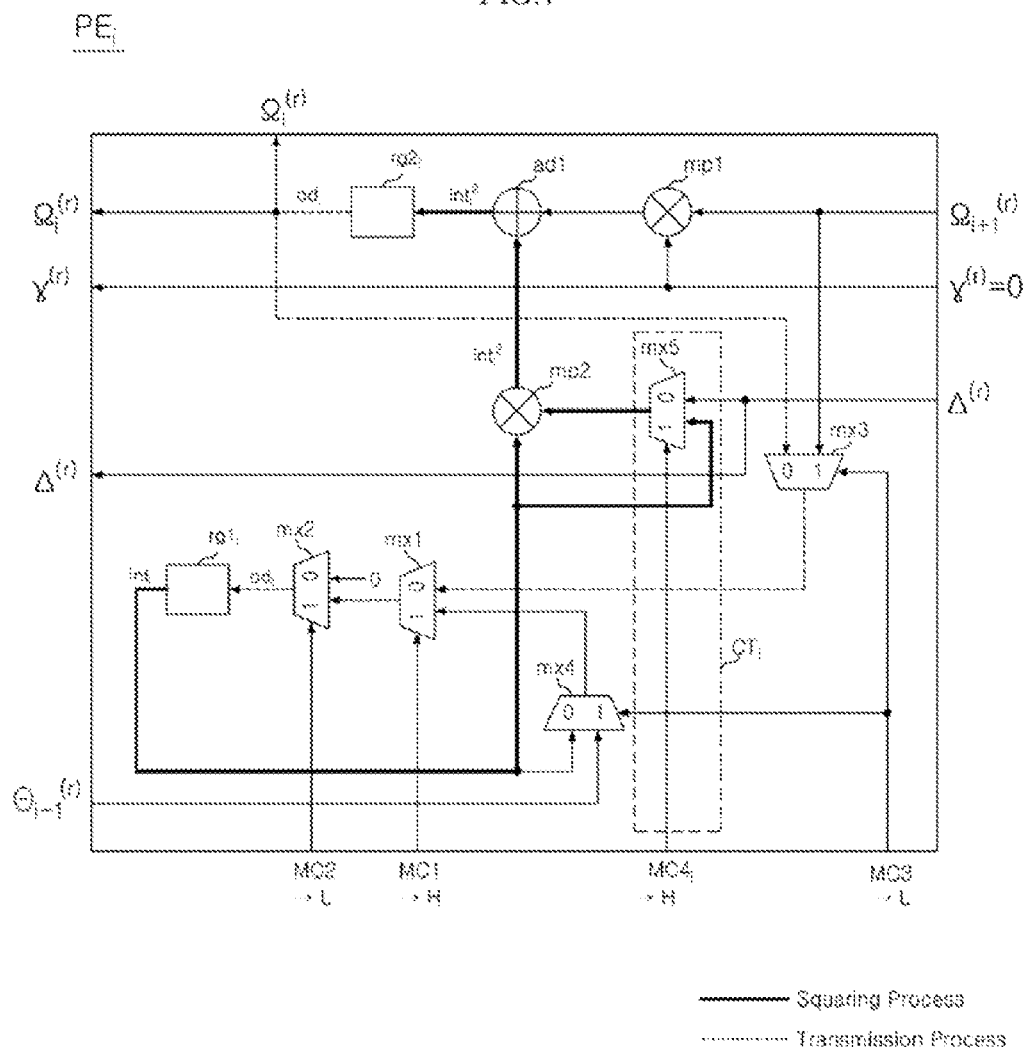
FIGS. 7 and 8 are diagrams explaining a method for the processing unit shown in FIG. 3 to simultaneously perform a computing operation and a latching operation.
Figure 8:
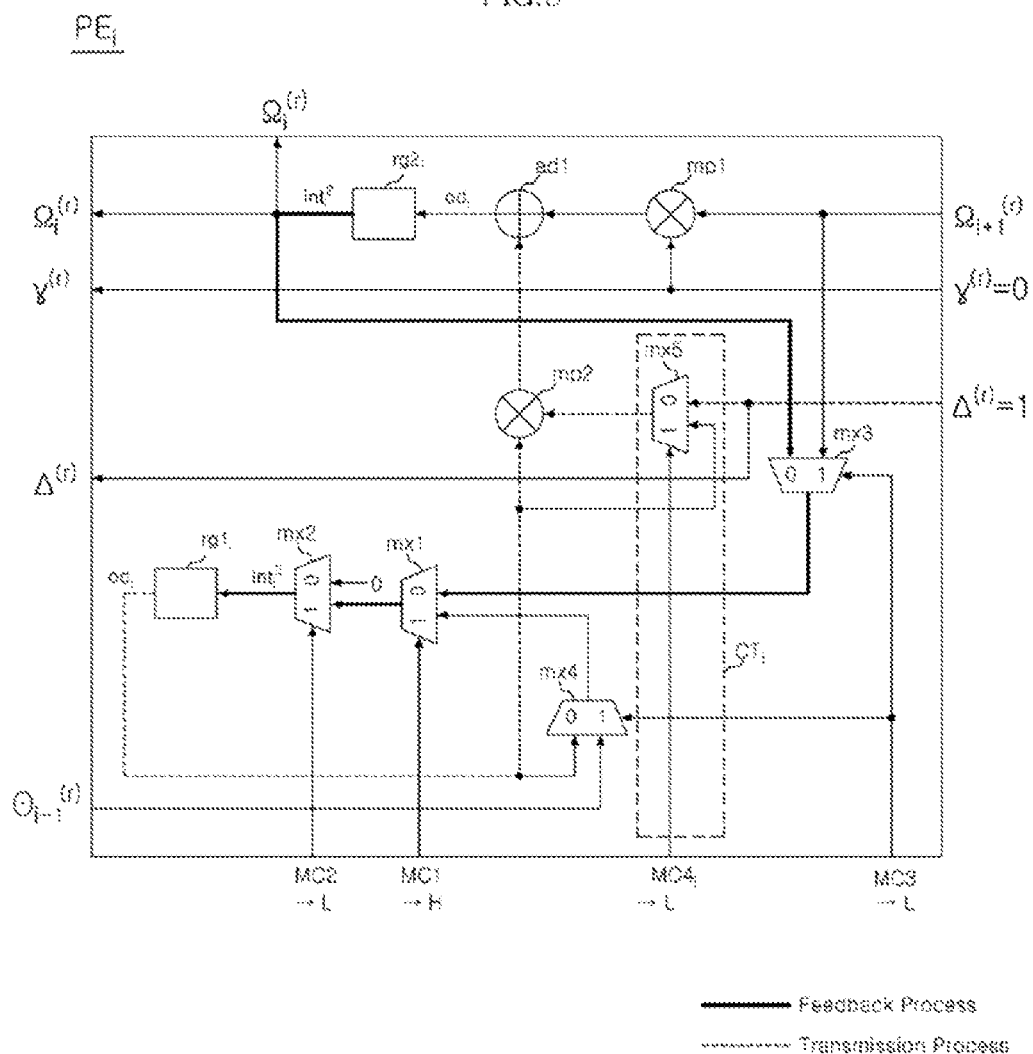

FIGS. 7 and 8 are diagrams explaining a method for the processing unit $PE_i$ shown in FIG. 3 to simultaneously perform a computing operation and a latching operation.

FIG. 7 shows a squaring process in which the initial value $int_i$ stored in the first register $rg1_i$ is squared and the squared value $int_i^2$ is stored in the second register $rg2_i$ when the processing unit $PE_i$ performs the computing operation in the first mode. Further, FIG. 7 shows a transmission process in which the value $od_i$ originally stored in the second register $rg2_i$ is transmitted to the first register $rg1_i$ and is conserved therein.

FIG. 8 shows a feedback process in which the squared value $int_i^2$ stored in the second register $rg2_i$ is fed back to the first register $rg1_i$ and is stored therein. Further, FIG. 8 shows a transmission process in which the value $od_i$ conserved in the first register $rg1_i$ through the process of FIG. 7 is transmitted back to the second register $rg2_i$ and is conserved therein.

According to an embodiment, upon entry to the first mode, the processing unit $PE_i$ not only may store the first odd syndrome value in the first register $rg1_i$ as the initial value $int_i$, but also may store the second odd syndrome value $od_i$ corresponding to it, in the second register $rg2_i$. That is to say, the value originally stored in the second register $rg2_i$ may be the second odd syndrome value $od_i$. In the first mode, the processing unit $PE_i$ may perform the computing operation for the initial value $int_i$, and at the same time, may perform the latching operation for the second odd syndrome value $od_i$. In other words, the processing unit $PE_i$ may conserve the second odd syndrome value $od_i$ through the latching operation until it performs the error location polynomial generating operation in the second mode, based on the even syndrome value $ev_i$ and the corresponding second odd syndrome value $od_i$.

Referring to FIG. 7, the initial value $int_i$ stored in the first register $rg1_i$ may be squared, and the squared value $int_i^2$ may be stored in the second register $rg2_i$. This squaring process may be performed in substantially the same way as the squaring process of FIG. 4. The second odd syndrome value $od_i$ stored in the second register $rg2_i$ may be transmitted to the first register $rg1_i$ and be conserved therein. This transmission process may be performed in substantially the same way as the feedback process of FIG. 5. The squaring process and the transmission process may be performed at substantially the same time.

Referring to FIG. 8, the squared value $int_i^2$ stored in the second register $rg2_i$ may be fed back to the first register $rg1_i$ and be stored therein. This feedback process may be performed in substantially the same way as the feedback process of FIG. 5. The second odd syndrome value $od_i$ conserved in the first register $rg1_i$ may be transmitted back to the second register $rg2_i$ and be conserved therein. This transmission process may be performed in substantially the same way as the process of FIG. 5 in which the even syndrome value is transmitted from the first register $rg1_i$ to the second register $rg2_i$. The feedback process and the transmission process may be performed at substantially the same time.

The processing unit $PE_i$ may be inputted with the fourth control signal $MC4_i$ at the logic low to perform the error location polynomial generating operation in the second mode. The fifth multiplexer mx5 may output the delta $\Delta^{(r)}$ in response to the fourth control signal $MC4_i$ of the logic low.

The processing units $PE_0$ to $PE_{t-2}$ may generate the even syndrome values, based on the corresponding first odd syndrome values, in the first mode. In the case where a plurality of even syndrome values are needed to generate an error location polynomial, since the processing units $PE_0$ to $PE_{t-2}$ may simultaneously perform the computing operation for generating the plurality of even syndrome values, an advantage may be provided in that latency may be decreased.

Figure 9:
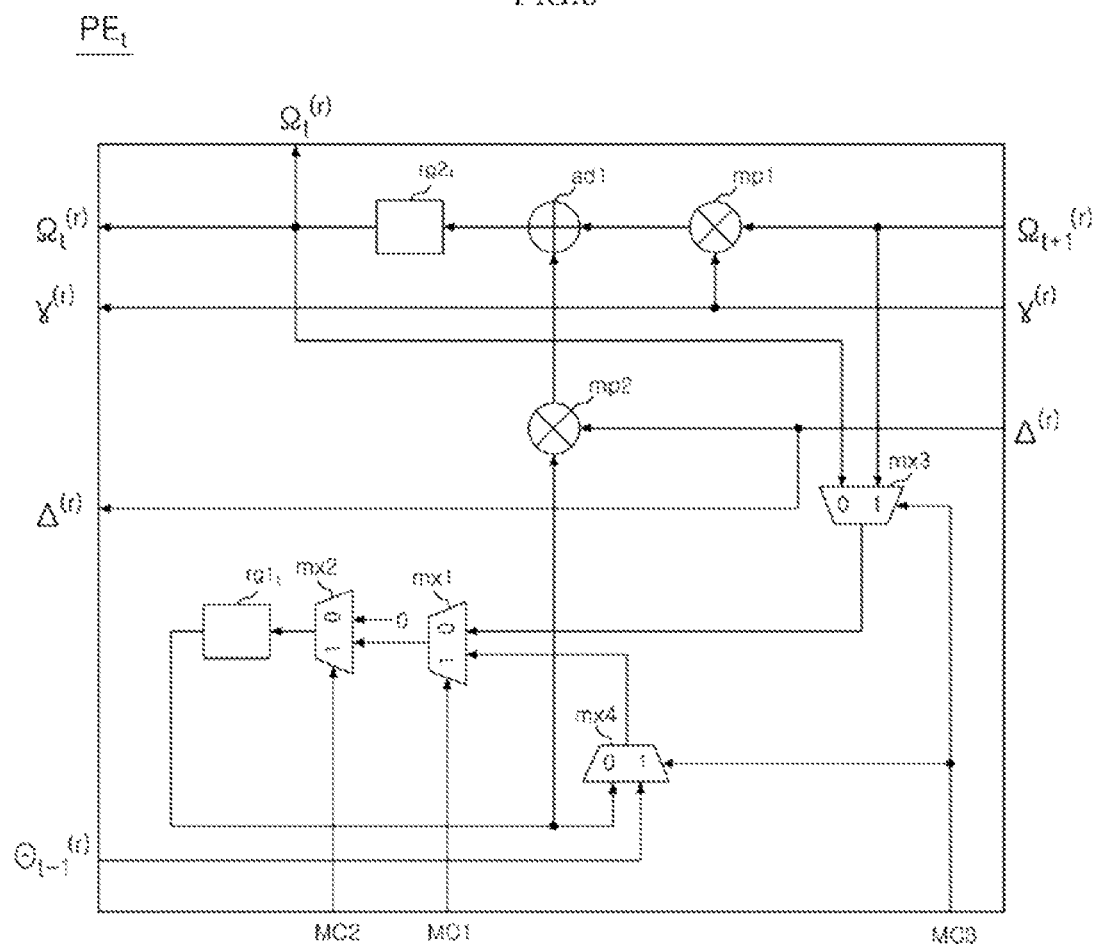
FIG. 9 is a circuit diagram showing in detail the configuration of the processing unit shown in FIG. 2.

FIG. 9 is a circuit diagram showing in detail the configuration of the processing unit $PE_t$ shown in FIG. 2. The configuration and the operating method of each of the plurality of processing units $PE_{t-1}$ to $PE_{t+f}$ shown in FIG. 2 may be substantially the same as the configuration and the operating method of the processing unit $PE_t$ of FIG. 9.

The processing unit $PE_t$ of FIG. 9 may have a similar configuration to the processing unit $PE_i$ of FIG. 3 except that it does not include the squaring control section $CT_i$. Therefore, detailed descriptions thereof will be omitted.

Figure 10:
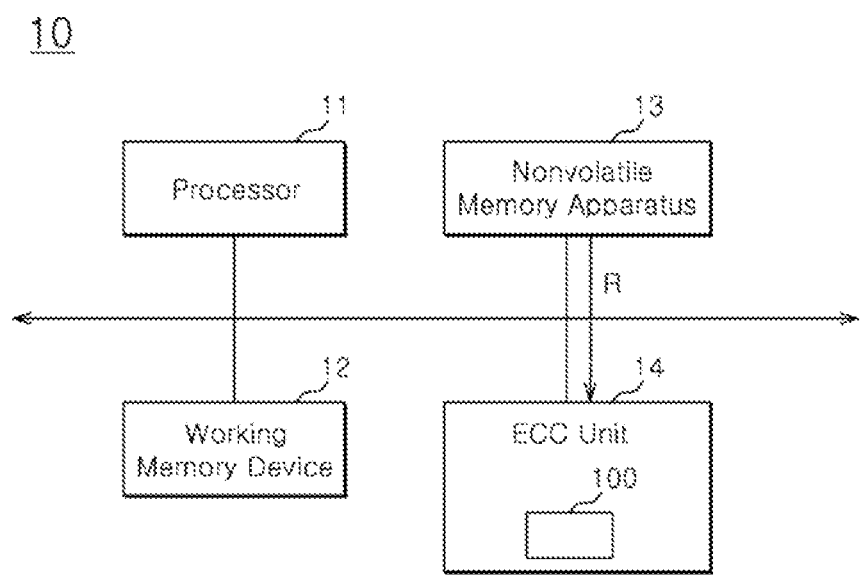
FIG. 10 is a block diagram exemplarily showing a data storage device including the data processing block shown in FIG. 1.

FIG. 10 is a block diagram exemplarily showing a data storage device 10 including the data processing block 100 shown FIG. 1.

The data storage device 10 may be configured to store the data provided from an external device (not shown), in response to an external write request. Also, the data storage device 10 may be configured to provide stored data to the external device in response to an external read request.

The data storage device 10 may include a PCMCIA (Personal Computer Memory Card International Association) card, a CF (compact flash) card, a smart media card, a memory stick, various multimedia cards such as MMC, eMMC, RS-MMC and MMC-micro, SD (secure digital) cards such as SD, mini-SD and micro-SD, a UFS (universal flash storage), or a solid state drive.

The data storage device 10 may include a processor 11, a working memory device 12, a nonvolatile memory apparatus 13, and an ECC unit 14.

The processor 11 may control the general operations of the data storage device 10. The processor 11 may generate a write, read or erase command to control the write, read or erase operations of the nonvolatile memory apparatus 13. The processor 11 may drive firmware to control the operations of the component elements included in the data storage device 10.

The working memory device 12 may store various data necessary for the operation of the data storage device 10. For example, the working memory device 12 may store the firmware to be driven by the processor 11. For another example, the working memory device 12 may temporarily store the data transmitted between the external device and the nonvolatile memory apparatus 13.

The nonvolatile memory apparatus 13 may perform a write operation in response to a write command to store the data transmitted from the external device. The nonvolatile memory apparatus 13 may perform a read operation in response to a read command to transmit stored data to the external device.

The ECC unit 14 may encode data before data is stored in the nonvolatile memory apparatus 13 at an external write request, in order to subsequently determine whether an error has occurred in data and correct the error. For example, the ECC unit 14 may encode data by generating error information of data and adding the generated error information to the data.

When encoded data, that is, a codeword R is read from the nonvolatile memory apparatus 13 at an external read request, the ECC unit 14 may decode the corresponding codeword R. The ECC unit 14 may correct an error which is detected as a result of performing a decoding operation.

The ECC unit 14 may include a data processing block 100. The data processing block 100 may be configured in the same way as described above with reference to FIGS. 1 to 3. The data processing block 100 may perform a decoding operation for the codeword R as described above.

The data processing block 100 may be included in not only a data storage device but also an electric system or a communication system which operates through transmission of various signals. The data processing block 100 may be used to detect and correct errors which are likely to occur in a channel as a path through which various signals are transmitted.

As is apparent from the above descriptions, the ELP solver according to the embodiment of the present invention may generate even syndrome values necessary for the generation of an error location polynomial, based on the odd syndrome values generated by a syndrome computation unit.

While certain embodiments have been described above, it will be understood by those skilled in the art that the embodiments described are by way of example only. Accordingly, the data processing block and the data storage device including the same described herein should not be limited based on the described embodiments. Rather, the data processing block and the data storage device including the same described herein should only be limited in light of the claims that follow when taken in conjunction with the above description and accompanying drawings.

What is claimed is:

1. A data processing block comprising:
   a syndrome computation unit suitable for generating odd syndrome values in response to a received codeword;
   an error location polynomial (ELP) solver suitable for generating even syndrome values, based on the odd syndrome values in a first mode, and generating an error location polynomial, based on the odd syndrome values and the even syndrome values in a second mode; and
   a Chien search unit suitable for generating solutions of the error location polynomial,
   wherein the ELP solver comprises a first processing unit and a second processing unit, and
   wherein each of the first processing unit and the second processing unit is inputted with a corresponding first odd syndrome value, among the odd syndrome values, as an initial value, performs a computing operation of squaring the initial value corresponding thereto and feeds back a squared value as a new initial value, in the first mode.

2. The data processing block according to claim 1, wherein each of the first processing unit and the second processing unit repeatedly performs the computing operation for the new initial value that is fed back.

3. The data processing block according to claim 1, wherein the first processing unit and the second processing unit generate respective even syndrome values that are different from each other through the computing operation.

4. The data processing block according to claim 1, wherein the first processing unit and the second processing unit perform the computing operation at the same time.

5. The data processing block according to claim 1, wherein the first processing unit and the second processing unit are suitable for performing a latching operation of conserving values stored in respective registers, in the first mode.

6. The data processing block according to claim 5, wherein the second processing unit generates an even syndrome value through the computing operation, and conserves the even syndrome value through the latching operation while the first processing unit performs the computing operation.

7. The data processing block according to claim 5, wherein each of the first processing unit and the second processing unit performs the latching operation for a corresponding second odd syndrome value, among the odd syndrome values, and at the same time performs the computing operation for a corresponding first odd syndrome value, among the odd syndrome values.

8. The data processing block according to claim 1, wherein each of the first processing unit and the second processing unit comprises a squaring control section suitable for controlling the initial value to be squared, in response to a control signal.

9. The data processing block according to claim 8, wherein the squaring control section outputs a first input to a multiplier which is inputted with the initial value as a second input in response to the control signal, wherein the first input is the initial value or an identity element for multiplication.

10. The data processing block according to claim 1, wherein the ELP solver further comprises:
    a control unit suitable for outputting a first control signal corresponding to the first processing unit and a second control signal corresponding to the second processing unit.

11. The data processing block according to claim 1, wherein the ELP solver comprises:
    a plurality of calculation processing units suitable for generating even syndrome values based on first odd syndrome values of the odd syndrome values, respectively, while conserving second odd syndrome values of the odd syndrome values, respectively, in the first mode,
    wherein the calculation processing units generate the error location polynomial based on the second odd syndrome values and the even syndrome values in the second mode.

12. The data processing block according to claim 11, wherein the ELP solver further comprises:
    a plurality of standby processing units suitable for generating the error location polynomial based on the odd syndrome values or setting values in the second mode.

13. A data storage device comprising:
    a nonvolatile memory apparatus suitable for reading a stored codeword; and
    a data processing block suitable for performing a decoding operation for the codeword,
    wherein the data processing block includes:
    a syndrome computation unit suitable for generating odd syndrome values in response to the codeword;
    an error location polynomial (ELP) solver suitable for generating even syndrome values, based on the odd syndrome values in a first mode, and generating an error location polynomial, based on the odd syndrome values and the even syndrome values in a second mode; and
    a Chien search unit suitable for generating solutions of the error location polynomial, wherein the ELP solver comprises a first processing unit and a second processing unit, and wherein each of the first processing unit and the second processing unit is inputted with a corresponding first odd syndrome value, among the odd syndrome values, as an initial value, performs a computing operation of squaring the initial value corresponding thereto and feeds back a squared value as a new initial value, in the first mode.

14. The data storage device according to claim 12, wherein the first processing unit and the second processing unit generate respective even syndrome values that are different from each other through the computing operation.

15. The data storage device according to claim 12, wherein the first processing unit and the second processing unit perform the computing operation at the same time.

16. The data storage device according to claim 12, wherein the second processing unit generates an even syndrome value through the computing operation, and conserves the even syndrome value through a latching operation while the first processing unit performs the computing operation.

* * * * *